United States Patent [19]

Quidort

[11] 3,943,446

[45] Mar. 9, 1976

[54] POWER AND MODULATION CONTROL SYSTEM

[75] Inventor: Vaughn L. Quidort, Lochearn, Md.

[73] Assignee: Westinghouse Electric Corporation, Pittsburgh, Pa.

[22] Filed: Sept. 30, 1974

[21] Appl. No.: 510,827

[52] U.S. Cl. ............... 325/144; 307/60; 307/264; 325/159; 325/187; 328/175
[51] Int. Cl.² .......................................... H04B 1/04
[58] Field of Search ............ 325/62, 144, 147, 149, 325/150, 151, 159, 186, 187; 307/60, 140, 264, 297; 328/168, 173, 175

[56] References Cited
UNITED STATES PATENTS

| | | | |
|---|---|---|---|
| 3,080,524 | 3/1963 | Davey et al. | 325/187 |
| 3,115,611 | 12/1963 | Potts, Jr. et al. | 331/183 |
| 3,155,838 | 11/1964 | Brahm | 307/88.5 |
| 3,262,056 | 7/1966 | Johnson et al. | 325/145 |
| 3,440,566 | 4/1969 | Swanson | 332/9 |
| 3,486,128 | 12/1969 | Lohrmann | 330/40 |
| 3,506,920 | 4/1970 | Swanson | 325/142 |
| 3,551,851 | 12/1970 | Engel | 332/9 |
| 3,585,517 | 6/1971 | Herbert | 330/10 |
| 3,644,832 | 2/1972 | Sherman, Jr. | 325/186 |
| 3,828,270 | 8/1974 | Ebisch | 330/130 |

Primary Examiner—Robert L. Griffin
Assistant Examiner—Marc E. Bookbinder
Attorney, Agent, or Firm—J. B. Hinson

[57] ABSTRACT

A system for controlling and maintaining the power output of a broadcast transmitter under varying line voltage conditions, including a pulse width modulator wherein a triangular wave acting as a reference input is compared to the audio input. Power is controlled by varying the amplitude of the triangular wave relative to the audio input which additionally includes a DC bias thereby increasing or decreasing the comparator square wave output duty cycle which output is used to control the transmitter's RF power amplifier. Three separate DC control inputs, respectively, for automatic power control, remote or local manual power control, and a slow start control are summed and fed to an operational DC amplifier which provides a composite DC output which is fed to a triangular waveform generator in order to control the amplitude of the triangular waveform generated thereby.

12 Claims, 3 Drawing Figures

POWER AND MODULATION CONTROL SYSTEM

BACKGROUND OF THE INVENTION

1. Field of the Invention

This invention relates generally to means for controlling and maintaining power output of a broadcast transmitter constant under varying line voltage conditions and more particularly to means for providing power control without affecting modulation percentage while at the same time insuring against overmodulation.

2. Description of the Prior Art

The present invention utilizes pulse width or pulse duration modulation for controlling power wherein a triangular waveform is compared against the audio signal. Pulse width modulators responsive to an input signal for producing an essentially square wave output signal in which the width of the pulses is dependent upon the comparison between a triangular waveform and an audio input are, per se, well known. Such apparatus is taught for example in: U.S. Pat. No. 3,440,566, H. I. Swanson; U.S. Pat. 3,551,851, J. C. Engel; and U.S. Pat. No. 3,585,517, R. B. Herbert.

SUMMARY

Briefly, the subject invention is directed to improved means for controlling and maintaining a constant power output of a broadcast radio transmitter, operating under varying line voltage conditions, without affecting modulation percentage or allowing inadvertent overmodulation by the utilization of a pulse width modulated square wave whose duty cycle is increased or decreased by varying the amplitude of a triangular reference waveform applied to one input of a comparator whose other input comprises an audio input signal of a predetermined DC level. The amplitude of the triangular waveform is varied by means of a DC signal applied to a triangular waveform generator which DC signal comprises the output of an operational amplifier whose input is connected to a signal summing point. The summing point is adapted to have signals applied thereto corresponding to an automatic power control input which is responsive to the measure of the transmitter's RF amplifier input voltage, a remote and/or local manual power control input, and a "slow start" control input. The automatic power control input is obtained by sensing the voltage across the RF amplifier by utilizing an optical coupled sensor including a light emitting or photo diode and a photosensitive transistor coupled together by means of an optical coupler comprising a light tight housing or package. The remote and/or local manual power control is generated by an up-down digital counter coupled to a digital to analog converter whose output provides a DC signal indicative of the desired power output. The slow start control is activated each time the RF carrier is turned on and consists in developing a DC voltage across a capacitor in an RC charging circuit. RF power control is effected by the pulse width modulated square wave which is fed to a modulation switch which in turn is coupled between a point of reference potential or ground and one side of the power amplifier through a filter tuned to eliminate the frequency of the square wave.

DESCRIPTION OF THE PREFERRED EMBODIMENTS

Figure 1:
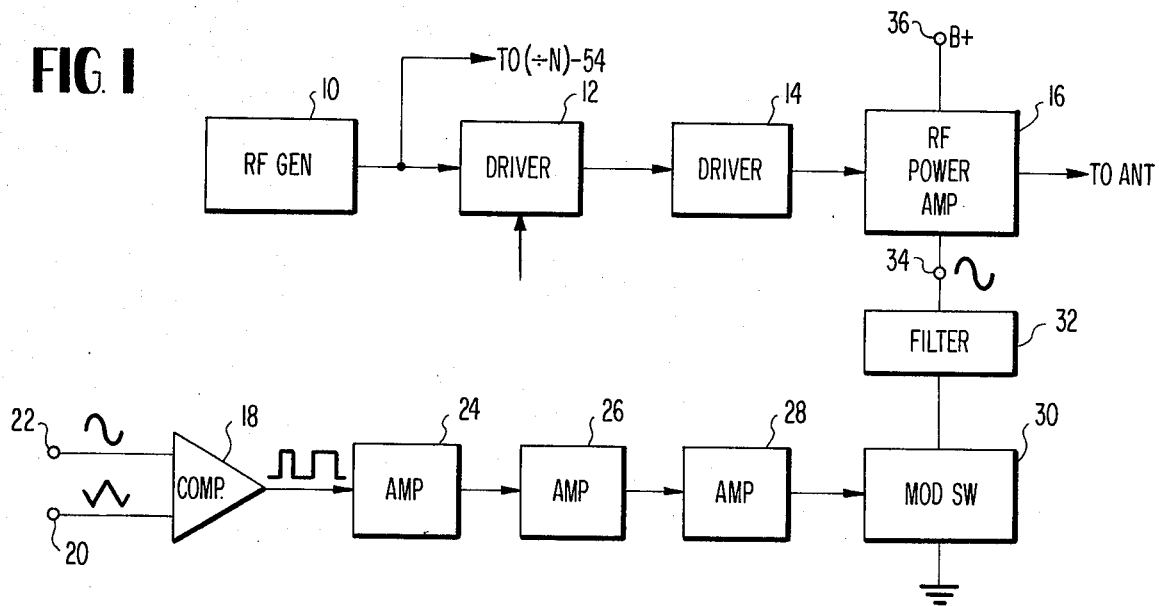
FIG. 1 is a block diagram illustrative of a radio transmitter controlled in accordance with the subject invention.

Referring now to the drawings and more particularly to FIG. 1, there is disclosed the operational environment of the subject invention which comprises, for example, a radio transmitter including an RF generator 10 which is adapted to provide a carrier signal of predetermined RF frequency. The carrier signal is fed through one or more driver amplifiers, for example circuits 12 and 14 where it is then coupled to a modulated RF power amplifier 16 whose output is fed to a radiating antenna, not shown. The RF power amplifier 16 is modulated by means of a pulse width modulated square wave signal generated in a comparator circuit 18 having as one input a variable amplitude triangular waveform having a fixed frequency relative to the RF carrier frequency which effectively acts as a subcarrier and comprises the reference signal against which an audio input signal is compared. The triangular waveform is shown being applied to terminal 20 while the audio input is applied to terminal 22. The pulse width modulated square wave is fed through a plurality of amplifiers for example circuits 24, 26, and 28 to a modulation switch 30. One side of the modulation switch 30 is connected to a point of reference potential, hereinafter referred to as ground, while the other side of the switch 30 is connected to a subcarrier filter 32 which is connected to one side of the RF power amplifier such as shown by terminal 34. The other side of the power amplifier is coupled to a B+ supply potential applied to terminal 36.

It can be seen therefore that the RF power amplifier 16 is returned to ground through the filter 32 and the modulation switch 30. Since the pulse width modulated square wave appearing at the output of the comparator 18 includes sidebands containing the square wave frequency as well as audio frequencies, the filter 32 effectively removes the square wave, leaving an audio modulating signal of a predetermined DC level at terminal 34. Thus the RF carrier level provided by the RF generator 10 modulated and applied to the antenna for external radiation is determined by the DC level appearing at terminal 34.

Figure 2:
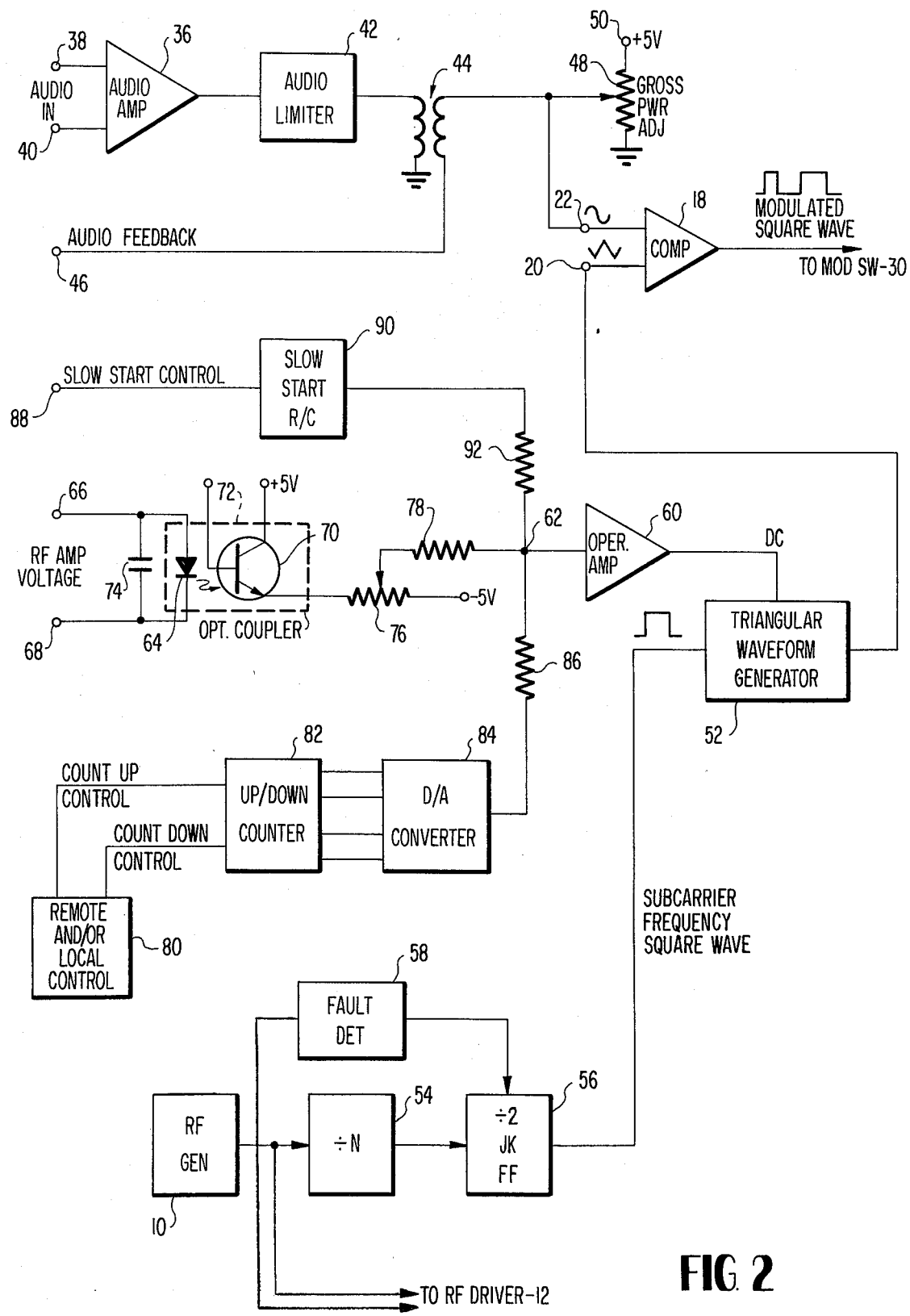
FIG. 2 is an electrical block diagram illustrative of the preferred embodiment of the subject invention.

Referring now to the preferred embodiment of the subject invention, reference is now made to FIG. 2. The broad concept of producing a pulse width modulated square wave by comparing an input signal against a triangular wave is known by those skilled in the art. However, it is the object of the subject invention to set the DC level of the input signal and then control, i.e. vary the amplitude of the triangular reference wave for increasing or decreasing the duty cycle (pulse width) of the square wave for controlling the output power from the RF power amplifier 16 shown in FIG. 1. This is due to the fact that the relative DC position of the audio signal to the triangular waveform determines the carrier level of the transmitter as established by the DC potential appearing at terminal 34 of FIG. 1, while the swing of the audio relative to the triangular waveform determines the percentage of modulation.

Accordingly, the audio input to the comparator 18 is provided by an audio amplifier coupled to input terminals 38 and 40. The amplifier 36 amplifies the audio input signal to a relatively high level and is then coupled to a limiter stage 42 which is adapted to limit the audio on the positive peaks. It should be pointed out that this method of modulation is inherently going to limit the percentage of modulation to 100% on negative audio peaks if properly adjusted; however, the positive peaks could go above legal limits if not clipped at a predetermined level. This is the reason for the positive peak clipping. The output of the audio limiter 42 is fed to primary winding of an audio transformer 44 whose secondary winding has one side coupled to terminal 46 to which is applied an audio feedback signal for overcoming distortion. The other side of the secondary winding of the transformer 44 is connected to input terminal 22 of the comparator 18. Additionally, a DC bias is also applied to input terminal 22 by means of a potentiometer 48 coupled between ground and a +5 volt supply applied to terminal 50. The position of the slider element of the potentiometer 48 provides a gross power adjustment of the transmitter inasmuch as it is adapted to position the DC level of the audio input signal appearing at terminal 22 relative to the triangular wave appearing at terminal 20. Inasmuch as the potentiometer 48 is utilized for a gross power adjustment, its setting normally remains substantially unchanged once it has been made. Variation of the power transmitted around the gross power adjustment point set by the potentiometer 48, however, is effected by varying the amplitude of the triangular wave applied to terminal 20.

Three separate inputs are utilized to control the amplitude of the triangular waveform applied to terminal 20. First of all, a triangular waveform generator 52 well known to those skilled in the art receives a rectangular initiating input signal which is derived from the RF generator 10 in order to maintain signal coherence, that is a fixed phase relationship between the RF carrier and the pulse width modulated square wave. The frequency of the RF generator 10 is reduced by means of a frequency divider (÷N) circuit 54 and a count of two (÷2) flip-flop circuit 56. The output of the flip-flop circuit 56 comprises a subcarrier, for example 70KHz, which is the frequency of the triangular waveform appearing at the output of the waveform generator 52. The purpose of the flip-flop 56 is to provide a relatively easy means for inhibiting application of the subcarrier input to the triangular waveform generator 52 in the event of a transmitter fault. A suitable fault detector circuit 58 is coupled both to the driver circuit 12 shown in FIG. 1 and the flip-flop 56 shown in FIG. 2 so that in the event of a fault occurring such as by lightning stroke or the like, the output of the RF generator 10 can be temporarily blocked by suitably disabling the driver circuit 12 as well as inhibiting the flip-flop 56 so that the subcarrier applied to the waveform generator 52 is also momentarily rendered inoperative. Thus, in the event of a fault, the generation of the modulated square wave is temporarily inhibited as well as interrupting the carrier coupled to the RF power amplifier 16.

The amplitude of the triangular waveform from the output of the waveform generator 52 is controlled by a DC signal applied to the generator 52 from an operational DC amplifier 60. The input of the operational amplifier 60 is connected to a signal summing point 62 whereupon any one of or a combination of three DC signal inputs can control the amplitude of the triangular waveform applied to the comparator 18. The first control comprises an automatic or closed servo loop control of the selected output power of the transmitter and consists of a light emitting or photo diode 64 suitably coupled to the output of the RF power amplifier 16 shown in FIG. 1 by means of terminals 66 and 68. The diode 64 senses the power output of the transmitter and generates a light or photo signal accordingly. This signal is coupled to a photosensitive transistor 70 in a suitable optical coupler device 72 which may be, for example, a light tight housing or package. A capacitor 74 is coupled across the light emitting diode 64 in order to provide a smoothing or filtering action. The transistor 70 provides an electrical signal indicative of the photo diode's 64 output across the emitter resistor 76. The emitter resistor comprises a potentiometer whose slider element is coupled to the summing point 62 via the summing resistor 78.

In addition to the automatic control, a remote and/or local manual control is provided by suitable power selector means 80 coupled to an updown digital counter means 82 including a pulse source and an up-/down digital counter which selectively counts up or down depending on the power output desired. The up-down counter is coupled to a digital to analog converter 84 which provides a DC output in accordance with the desired power. The DC output of the digital to analog converter 84 is coupled to the summing point 62 by means of the summing resistor 86. The third control is a "slow start" control for bringing up the transmitter's power relatively slowly each time the carrier is turned on, i.e., the RF generator 10 is rendered operative after an OFF condition. The slow start control comprises a DC potential being applied to terminal 88, which terminal is connected to an RC (resistance-capacitance) charging circuit. The charging circuit is then coupled to the summing point 62 by means of the summing resistor 92. Thus the DC voltage appearing at the summing point 62 from either of the controls is suitably amplified in the operational amplifier 60 and applied to the triangular waveform generator 52.

Figure 3:
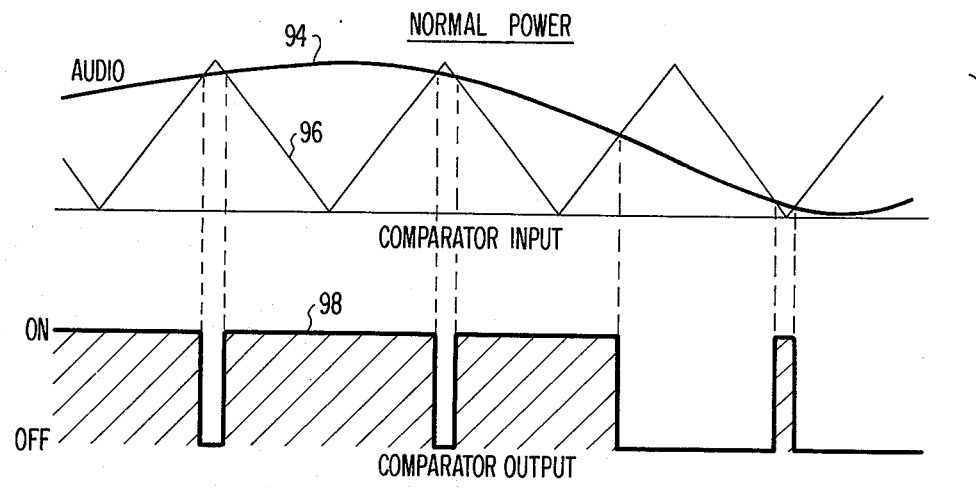
FIG. 3 is a set of waveforms helpful in understanding the operation of the subject invention.
Figure 3:
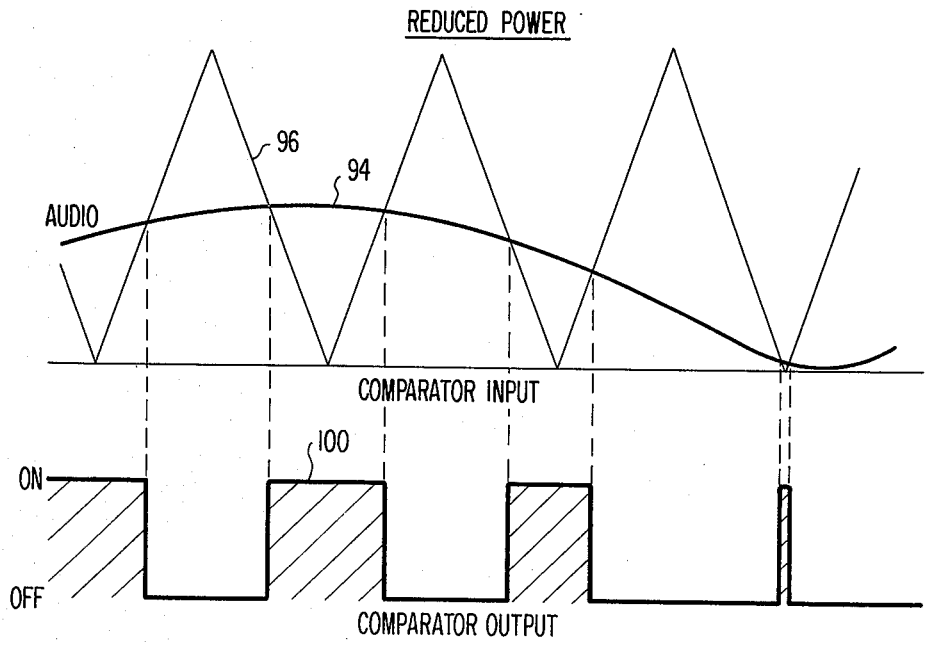

Operation of the control system comprising the subject invention can best be understood by reference to the waveforms shown in FIG. 3. Assuming that an initial gross power adjustment is made by the setting of potentiometer 48 whereupon an initial relative DC position of an audio signal 94 is made relative to a triangular waveform 96, the comparator circuit 18 accordingly develops a pulse width modulated square wave 98 in accordance with the intersection of the rise and fall of the amplitude of the waveform 96 with the audio waveform 94. The high value of the waveform 98 is adapted to turn the modulation switch 30 ON while the low value is adapted to turn it OFF. Since the frequency of the triangular waveform 96 constitutes a subcarrier frequency, typically 70KHz, the pulse width modulated square wave 98 contains sidebands of the frequency of the resultant square wave 98 as well as the audio signal 94. The filter 32 is tuned to reject the frequency (70KHz) of the square wave 98 so that it effectively removes the sidebands corresponding to the square wave, leaving the audio waveform 94 and its DC conponent which then appears at terminal 34. Assuming now that a power change is desired such as reduced power output from the transmitter, it is merely necessary to increase the amplitude of the triangular waveform such as shown by waveform 96'. This can be done by varying the setting of control 80. Since the relative amplitude of the audio input 94 remains unchanged, a pulse width modulated square wave 100 will result. A comparison of waveforms 98 and 100 reveals that they are substantially identical in shape, but with the duty cycle changed, that is the relative times between when the modulation switch 30 is turned on and off. For example, under normal power conditions, the ON time as indicated by the shaded area under the waveforms 98 and 100 indicates that the ON time is relatively greater than that for the reduced power, although the action of the filter 32 would yield the same audio waveform 94. Thus by increasing the amplitude of the triangular waveform 96 as commanded by either of the means coupled to the summing point 62, the modulation switch 30 is driven on and off in accordance with the pulse width modulated square wave to establish an average DC level at terminal 34 relative to ground potential with the audio waveform swinging on either side of this DC level resulting in a power control which does not effect modulation percentage. The control afforded by the subject invention is particularly adapted for automatic power control of unattended broadcast transmitters.

Having thus described what at present is considered to be the preferred embodiment of the subject invention,

I claim:

1. A system for controlling the power output of a transmitter in response to the operation of a modulation switch turned on and off by a pulse width modulated substantially square wave, comprising in combination:
  a. a comparator circuit coupled to said modulation switch and having first and second inputs respectively coupled to receive a DC biased modulating input signal and a regularly repetitive variable amplitude reference signal and producing said substantially square wave signal consisting of a pulse train in which the width and consequently the duty cycle of the pulses are proportional to the instantaneous amplitude of said DC biased modulating signal relative to the amplitude of the reference signal;
  b. a waveform generator, adapted to produce said regularly repetitive variable amplitude reference signal of a predetermined frequency, coupled to said second input of said comparator circuit, said waveform generator being operable in response to an initiating signal of said predetermined frequency and additionally receiving a control signal which is adapted to vary the amplitude of said reference signal;
  c. first circuit means responsive to the power output of said transmitter to generate at least a first signal indicative of the power output of said transmitter;
  d. second circuit means responsive to an external signal to generate at least a desired power output signal indicative of the desired power output of said transmitter; and
  e. combining circuit means for combining a plurality of signals to generate said control signal, said plurality of signals including at least said signal indicative of the power output of said transmitter and said desired power output signal, said control signal being coupled to said waveform generator such that the power output of said transmitter is controlled at the desired level.

2. The system as defined by claim 1 further including a slow start control circuit comprising an RC charging circuit operable at transmitter turnon for providing to said combining circuit a slowly increasing DC signal to a predetermined level.

3. The system as defined by claim 1 wherein said waveform generator comprises a triangular waveform generator and wherein said control signal applied thereto and generated by said combining circuit means comprises a DC signal.

4. The system as defined by claim 1 further including circuit means for providing an audio feedback to said comparator thereby controlling distortion in the output signal of said transmitter.

5. The system as defined by claim 3 wherein said combining circuit means includes:
  a summing circuit coupled to said first and second circuit means for providing a composite signal therefrom; and
  an operational amplifier coupled to said summing circuit, being responsive to said composite signal and providing said DC control signal coupled to said waveform generator.

6. The system as defined by claim 5 wherein said first circuit means comprises:
  a light emitting semiconductor diode responsive to the output of said transmitter;
  optical coupler means; and
  a photosensitive semiconductor signal translation device coupled to said light emitting diode by said optical coupler means and being operative to provide said DC control signal indicative of the power output of said transmitter, said DC control signal being coupled to said summing circuit.

7. The system as defined by claim 6 wherein said semiconductor signal translating device comprises a transistor having an emitter circuit coupled to said summing circuit.

8. The system as defined by claim 5 wherein said second circuit means comprises manual power control means providing said desired power output signal.

9. The system as defined by claim 8 wherein said second circuit means is comprised of:
  means for selecting a desired power output setting;
  a digital counter circuit coupled to said power selector means and a pulse source;
  a digital to analog converter coupled to said counter circuit providing a DC signal indicative of the selected power output, said DC signal being coupled to said summing circuit.

10. A system as defined by claim 8 wherein said second circuit means additionally includes third circuit means comprising a slow start control circuit coupled to said summing circuit providing still another one of said plurality of control signals.

11. The system as defined by claim 10 wherein said slow start control circuit comprises an RC charging circuit, operative to generate a third DC signal, coupled to said summing circuit.

12. A modulator for modulating and controlling the average power output of an RF amplifier comprising in combination:
  a comparator circuit having first and second inputs respectively coupled to receive a DC biased modulating input signal and a regularly repetitive variable amplitude reference signal and producing a substantially square wave signal consisting of a pulse train in which the width and consequently the duty cycle of the pulses are proportional to the instantaneous amplitude of said DC biased modulating signal relative to the amplitude of the reference signal;

input circuit means for providing said modulating input signal including means for providing said DC bias to produce said DC biased modulating input signal, said DC bias establishing a first DC position of said modulating input signal relative to said reference signal and accordingly a gross power output setting of said RF amplifier;

a waveform generator, for producing said regularly repetitive variable amplitude reference signal of a predetermined frequency, coupled to said second input of said comparator circuit, said waveform generator being operable in response to an initiating signal of said predetermined frequency and additionally receiving a control input signal for varying the amplitude of said reference signal;

control circuit means operable in response to a second power output setting of said RF amplifier, generating said control input signal including circuit means coupling said control input signal to said waveform generator; and filter means coupled to receive said pulse train and produce therefrom a composite signal having an AC and a DC component with the DC component being primarily determined by the average duty cycle of said pulse train and the amplitude of the AC portion being determined by instantaneous duty cycle of said pulse train; and means for coupling said composite signal to said RF amplifier such that the average power of the output signal of said RF amplifier is determined by said DC component and is modulated by said AC component.

* * * * *